(12) United States Patent
Coleman

(10) Patent No.: US 7,646,173 B1
(45) Date of Patent: Jan. 12, 2010

(54) BATTERY SAFETY MONITOR SYSTEM

(75) Inventor: Jeffrey L. Coleman, San Diego, CA (US)

(73) Assignee: The United States of America as represented by the Secretary of Navy, Washington, DC (US)

( * ) Notice: Subject to any disclaimer, the term of this patent is extended or adjusted under 35 U.S.C. 154(b) by 1030 days.

(21) Appl. No.: 10/802,562

(22) Filed: Mar. 17, 2004

(51) Int. Cl.
*H02J 7/00* (2006.01)
*G01N 27/416* (2006.01)
*G08B 21/00* (2006.01)

(52) U.S. Cl. .................. 320/134; 320/136; 324/426; 324/427; 340/636.1; 340/636.21

(58) Field of Classification Search .............. 320/134, 320/136; 301/134
See application file for complete search history.

(56) References Cited

U.S. PATENT DOCUMENTS

| | | | |
|---|---|---|---|
| 5,646,534 A * | 7/1997 | Kopera | 324/434 |
| 5,808,469 A | 9/1998 | Kopera | |
| 6,628,207 B1 * | 9/2003 | Hemminger et al. | 340/870.02 |
| 2002/0111756 A1 * | 8/2002 | Modgil | 702/63 |

* cited by examiner

*Primary Examiner*—Edward Tso
*Assistant Examiner*—Yalkew Fantu
(74) *Attorney, Agent, or Firm*—Kyle Eppele; Allan Y. Lee; J. Eric Anderson

(57) ABSTRACT

A battery safety monitor system. The system includes at least one battery, at least one zener diode, at least one safety device, a microcontroller, a display device and a power supply. The at least one battery comprises at least one cell string capable of outputting voltage signals. The at least one zener diode is operatively coupled to the at least one battery cell string. The at least one safety device is operatively coupled to the at least one battery cell string. The microcontroller is operatively coupled to the at least one zener diode. The display device is operatively coupled to the microcontroller. The power supply is operatively coupled to the microcontroller and the display device.

16 Claims, 4 Drawing Sheets

Battery Safety Monitor System
100

BATTERY SAFETY MONITOR SYSTEM

BACKGROUND OF THE INVENTION

The present invention is generally in the field of battery monitors. Battery monitors provide data for at least one battery, which comprises cells or strings of cells.

Typical battery monitors do not incorporate safety devices. In addition, typical battery monitors have relatively high power consumption.

Therefore, a need exists for battery monitors that incorporate safety devices and reduce power consumption.

DETAILED DESCRIPTION OF THE INVENTION

The present invention is directed to a method and apparatus for battery safety monitor systems. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely exemplary embodiments of the invention. To maintain brevity, other embodiments of the invention that use the principles of the present invention are not specifically described in the present application and are not specifically illustrated by the present drawings.

DEFINITIONS

The following definitions and acronyms are used herein:

Acronyms:
BSMS—Battery Safety Monitor System
DCDD—Data Collection and Display Device
MUX—Multiplexer
A/D—Analog-to-Digital
PTC—Positive Thermal Coefficient
UART—Universal Asynchronous Receiver Transmitter Definitions:
Cell—one unit of a battery having a cathode and an anode
Battery Cell String—multiple cells in series
Battery array or Battery—a configuration of cells in either parallel or serial or combination.

The present inventive battery safety monitor system includes a battery monitor and a data collection and display device. In one embodiment, the present invention incorporates safety devices. In one embodiment, the present invention reduces power consumption. In one embodiment, the present invention can measure voltages of individual battery cell strings for a plurality of battery cell strings. The present invention is particularly useful in monitoring lithium-based batteries (e.g., lithium/thionyl chloride batteries).

Figure 1:
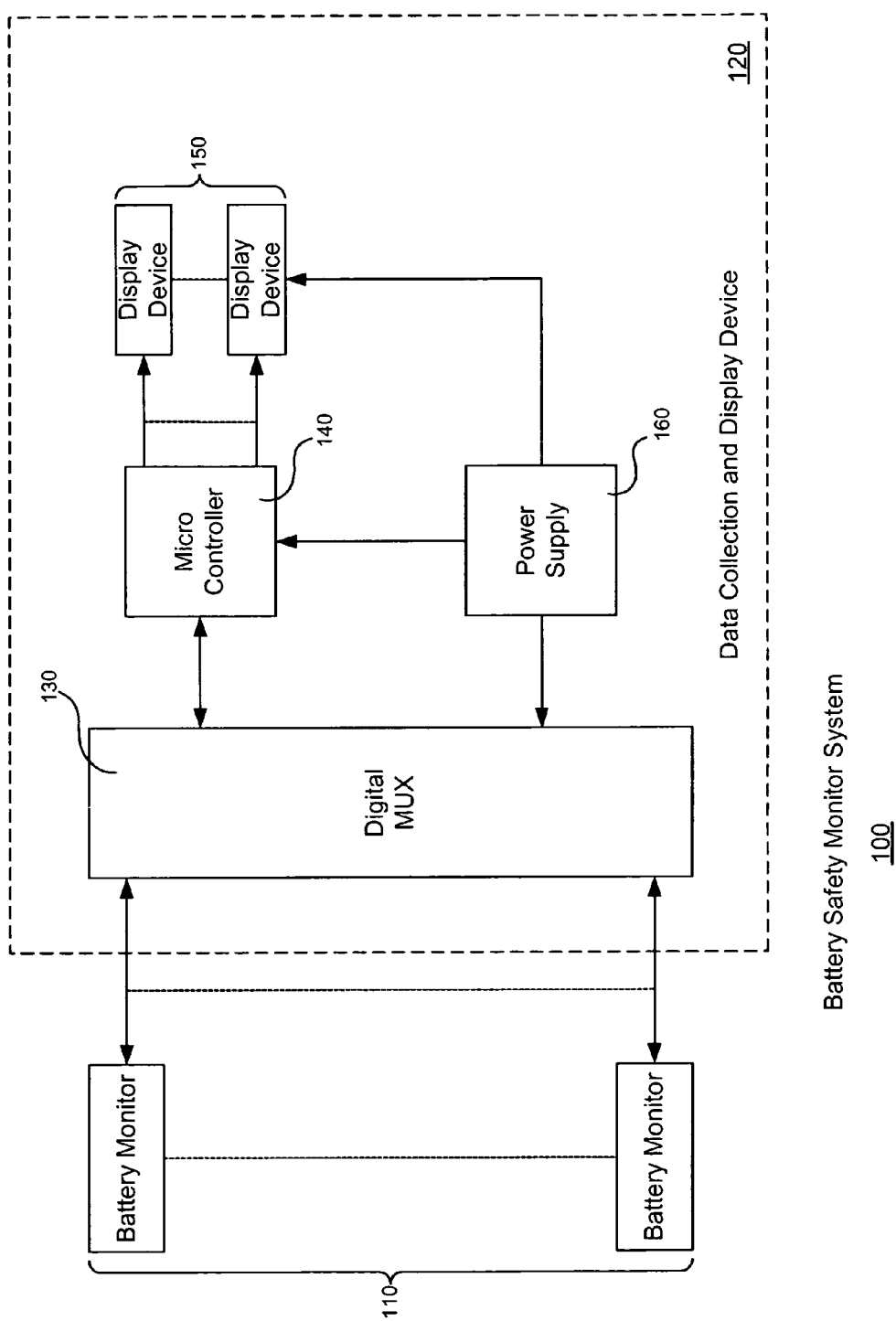
FIG. 1 is a block diagram of one embodiment of the present invention.

FIG. 1 is a block diagram of one embodiment of the present invention. As shown in FIG. 1, battery safety monitor system (BSMS) 100 includes at least one battery monitor 110 and data collection and display device (DCDD) 120. Battery monitor 110 is operatively coupled to DCDD 120. In one embodiment, BSMS 100 includes a plurality of battery monitors 110. In one embodiment, BSMS 100 includes a lone battery monitor 110. As described in detail below with reference to FIG. 2, battery monitor 110 includes at least one battery. Battery monitor 110 obtains information regarding at least one battery and outputs data to DCDD 120.

DCDD 120 includes digital multiplexer (MUX) 130, microcontroller 140, at least one display device 150 and power supply 160. Digital MUX 130 is operatively coupled to and receives data (e.g, digital voltage signals) from at least one battery monitor 110. Digital MUX 130 is operatively coupled to and receives power from power supply 160. Digital MUX 130 can receive power from microcontroller 140. Digital MUX 130 is capable of selectively receiving input data from one of a plurality of battery monitors 110. Digital MUX 130 is operatively coupled to and receives control signals from microcontroller 140. These control signals can include information regarding input selection. Digital MUX 130 outputs data to microcontroller 140. Microcontroller 140 is operatively coupled to and receives power from power supply 160. Digital MUX 130 outputs power to battery monitor 110. Microcontroller 140 is operatively coupled to and receives data from digital MUX 130. Microcontroller 140 includes software, firmware or instruction set, which operates microcontroller 140. Microcontroller 140 is capable of controlling at least one display device 150. In one embodiment, microcontroller 140 controls a plurality of display devices 150.

Display device 150 receives commands and/or data from microcontroller 140 regarding battery conditions. Display device 150 can include, for example, visual alarms, audible alarms, relay switches and serial interfaces coupled to display computers. In one embodiment, display device 150 is a set of lights (e.g., light emitting diodes) capable of indicating battery conditions. In one embodiment, display device 150 is an audio speaker (e.g., beeper) capable of sounding to indicate danger. In one embodiment, display device 150 is a relay switch coupled to an external alarm, where the relay switch closes to indicate danger. In one embodiment, display device 150 is a UART to RS232 converter coupled to a display computer. Display device 150 is operatively coupled to and receives power from power supply 160. In one embodiment, DCDD 120 includes a plurality of display devices 150. Power supply 160 is separate from battery cells being monitored, and thus, reduces battery power consumption.

Figure 2:
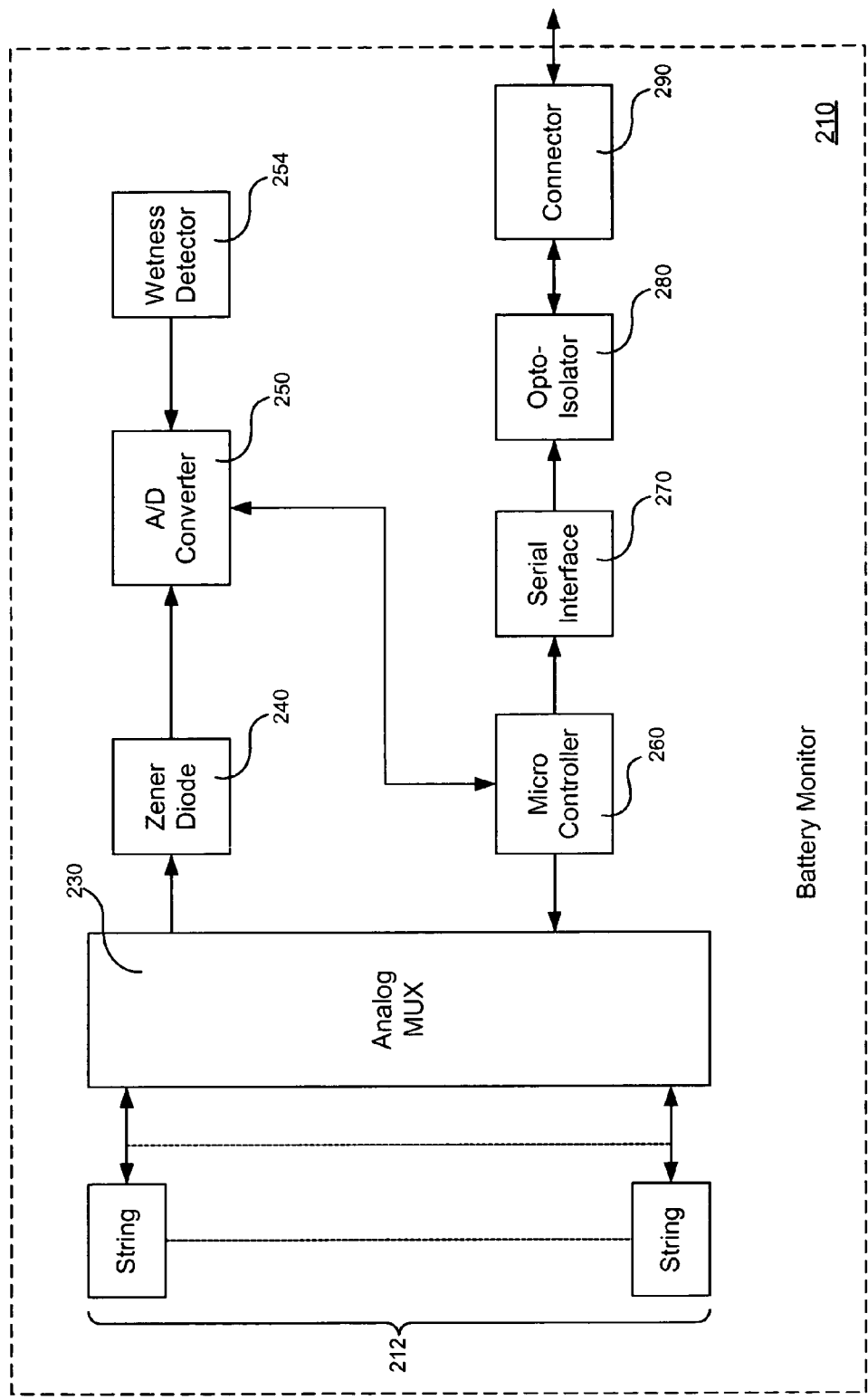
FIG. 2 is a block diagram of one embodiment of the present invention.

FIG. 2 is a block diagram of one embodiment of the present invention. FIG. 2 is a block diagram of one embodiment of battery monitor 110 of FIG. 1. As shown in FIG. 2, battery monitor 210 includes at least one string unit 212, analog multiplexer (MUX) 230, zener diode 240, analog-to-digital (A/D) converter 250, wetness detector 254, microcontroller 260, serial interface 270, optoisolator 280 and connector 290. As described in detail below with reference to FIG. 3, battery monitor 210 includes a battery cell string and at least one safety device. String unit 212 reduces danger via at least one safety device and outputs voltage signals to analog MUX 230. In one embodiment, battery monitor 210 includes a plurality of string units 212. In one embodiment, battery monitor 210 includes a lone string unit 212. Analog MUX 230 is operatively coupled to and receives voltage signals from at least one string unit 212. In one embodiment, analog MUX 230 is operatively coupled to a plurality of string units 212. Analog MUX 230 is capable of selectively receiving voltage signals from one of a plurality of string units 212 and outputting the voltage signals. In one embodiment, analog MUX 230 is capable of selectively isolating reception of voltage signals from a plurality of string units 212, which reduces power consumption of battery monitor 210. Analog MUX 230 is operatively coupled to and receives control signals from microcontroller 260, which can contain input selection information.

As shown in FIG. 2, Zener diode 240 is operatively coupled to and receives voltage signals from analog MUX 230. Zener diode 240 reduces the voltage signals to low voltage signals. Zener diode 240 outputs low voltage signals. A/D converter 250 is operatively coupled to and receives low voltage signals from zener diode 240. A/D converter 250 converts the low voltage signals into digital signals, which represent voltage measurements of one string unit 212 of a plurality of string units 212. A/D converter 250 is operatively coupled to microcontroller 260 and wetness detector 254. Wetness detector 254 is capable of detecting dangerous battery conditions such as, for example, battery venting of thionyl chloride. In one embodiment, wetness detector 254 includes two narrowly spaced conductors, which are operatively coupled to a high impedance voltage and an input to A/D converter 250. In one embodiment, wetness detector 254 operates by producing a reduced voltage when condensation of liquids such as thionyl chloride creates a low-impedance path between two narrowly spaced conductors. A/D converter 250 receives voltage signals from wetness detector 254 and outputs digital signals.

Microcontroller 260 receives digital signals from A/D converter 250. Microcontroller 260 is a low power microcontroller. Microcontroller 260 includes software, firmware or instruction set, which operates microcontroller 260. Microcontroller 260 outputs control signals to A/D converter 250 and analog MUX 230. A/D converter 250 receives control signals from microcontroller 260, which start a conversion process. Microcontroller 260 outputs digital signals. Serial interface 270 is operatively coupled and receives digital signals from microcontroller 260. In one embodiment, serial interface 270 comprises a universal asynchronous receiver transmitter (UART). In one embodiment, battery monitor 210 includes a Microchip PIC16LF877, which includes A/D converter 250, microcontroller 260 and serial interface 270. Serial interface 270 outputs digital signals. Optoisolator 280 is operatively coupled to and receives digital signals from microcontroller 260. Optoisolator 280 reduces danger by preventing reverse currents, which can be introduced by external devices, from entering string units 212 and battery cell strings of string units 212. Optoisolator 280 outputs digital signals. Connector 290 is operatively coupled to and receives digital signals from optoisolator 280. In one embodiment, connector 290 comprises long wires so that battery monitor 210 can be remotely situated from other devices such as DCDD 120 of FIG. 1. Connector 290 is operatively coupled and outputs power to optoisolator 280. Connector 290 receives power from digital MUX 130 of FIG. 1. Connector 290 outputs digital signals.

Figure 3:
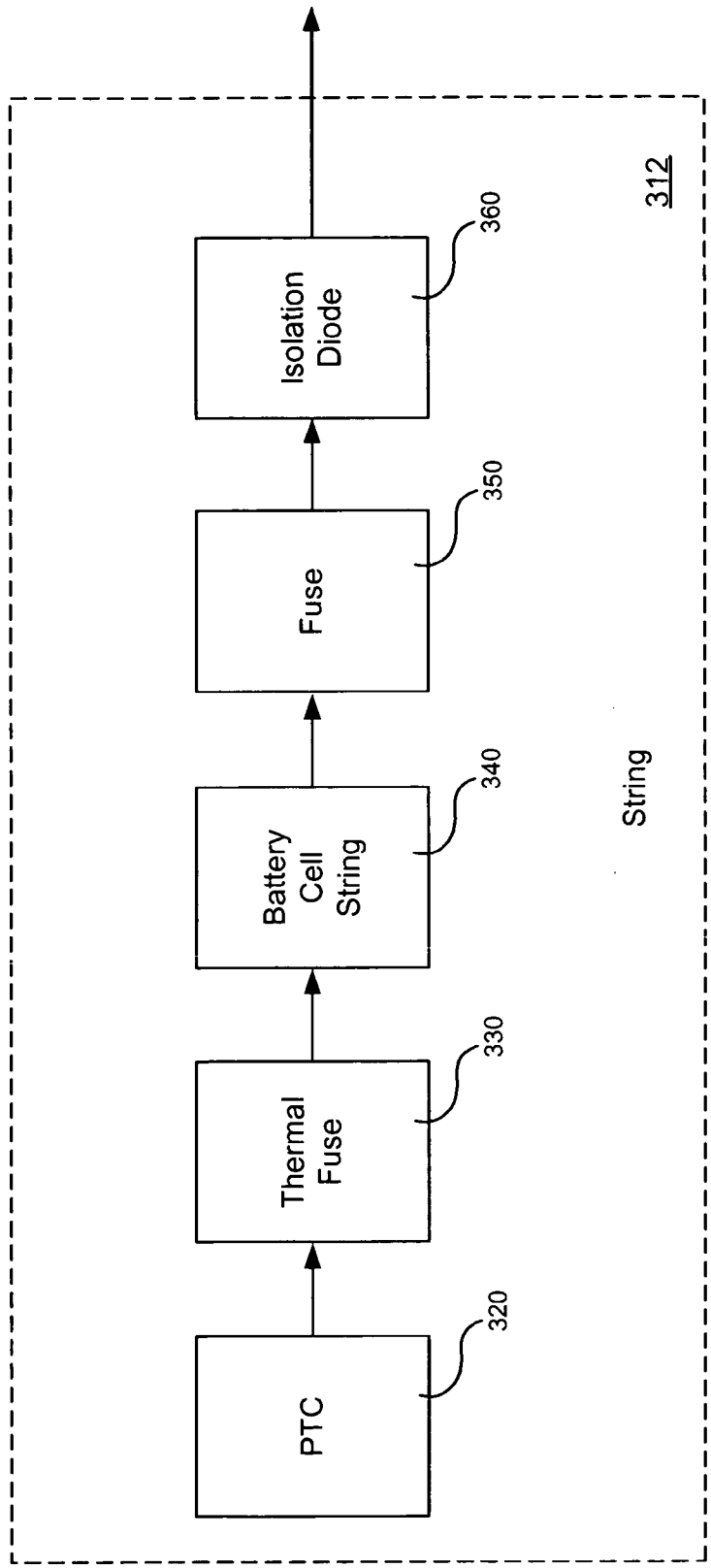
FIG. 3 is a block diagram of one embodiment of the present invention.

FIG. 3 is a block diagram of one embodiment of the present invention. FIG. 3 is a block diagram of one embodiment of string unit 212 of FIG. 2. As shown in FIG. 3, string unit 312 includes positive thermal coefficient (PTC) device 320, thermal fuse 330, battery cell string 340, fuse 350 and isolation diode 360. PTC device 320 is operatively coupled to thermal fuse 330 and reacts to current from battery cell string 340. PTC device 320 provides overcurrent protection with reference to battery cell string 340. In one embodiment, PTC device 320 automatically resets when an overcurrent condition ends. In one embodiment, PTC device 320 comprises a Raychem® Polyswitch RXE020. Thermal fuse 330 is operatively coupled to and conducts current from PTC device 320. Thermal fuse 330 is operatively coupled and situated in close proximity to battery cell string 340. Thermal fuse 330 is capable of preventing current flow (open switch mode) of battery cell string 340 when increased temperature is detected. In one embodiment, all string units 212 of battery monitor 210 of FIG. 2 include thermal fuses connected in series, where each battery cell string 340 is in close proximity to a thermal fuse.

Battery cell string 340 is a string of a battery array. In one embodiment, a battery array comprises 26 battery cell strings, where each string comprises four cells. In one embodiment, battery cell string 340 comprises lithium cells. Fuse 350 is operatively coupled to and receives current from battery cell string 340. Fuse 350 prevents overcurrent conditions. In one embodiment, fuse 350 comprises a standard overcurrent fuse. Fuse 350 outputs current. Isolation diode 360 is operatively coupled to fuse 350. Isolation diode 360 receives current from battery cell string 340 via fuse 350. Isolation diode 360 prevents reverse currents from entering battery cell string 340. In one embodiment, isolation diode 360 comprises a low-loss diode. In one embodiment, isolation diode 360 comprises a Schottky diode. Isolation diode 360 outputs voltage signals.

The operation of BSMS 100 is now described with reference to FIGS. 1-3. BSMS 100 of FIG. 1 includes safety devices such as PTC device 320, thermal fuse 330, fuse 350, isolation diode 360 of FIG. 3 and wetness detector 254 and optoisolator 280 of FIG. 2. These safety devices help prevent dangerous conditions, which can lead to damage to and/or explosion of battery cell strings 340 of FIG. 3. Analog MUX 230 of FIG. 2 receives voltage signals from battery cell string 340 of FIG. 3 via isolation diode 360 of FIG. 3. Microcontroller 260 of FIG. 2 transmits control signals to analog MUX 230 of FIG. 2, which include input selection information. Analog MUX 230 of FIG. 2 receives voltage signals from a plurality of string units 212. Analog MUX 230 of FIG. 2 selects one of a plurality of string units 212 of FIG. 2 to output based on input selection information received from microcontroller 260 of FIG. 2 via control signals. Zener diode 240 of FIG. 2 receives voltage signals from analog MUX 230 of FIG. 2 and reduces the voltage signals to low voltage signals. A/D converter 250 of FIG. 2 receives and converts low voltage signals to digital voltage signals. DCDD 120 of FIG. 1 receives digital voltage signals from battery monitor 210 of FIG. 2. Digital MUX 130 of FIG. 1 receives digital voltage signals from a plurality of battery monitors 110 of FIG. 1. Digital MUX 130 of FIG. 1 selects one of a plurality of battery monitors 110 of FIG. 1 to output based on input selection information received from microcontroller 140 of FIG. 1. Microcontroller 140 of FIG. 1 displays alerts via display devices 150 of FIG. 1 depending on data (e.g., digital voltage signals) received from digital MUX 130 of FIG. 1.

Figure 4:
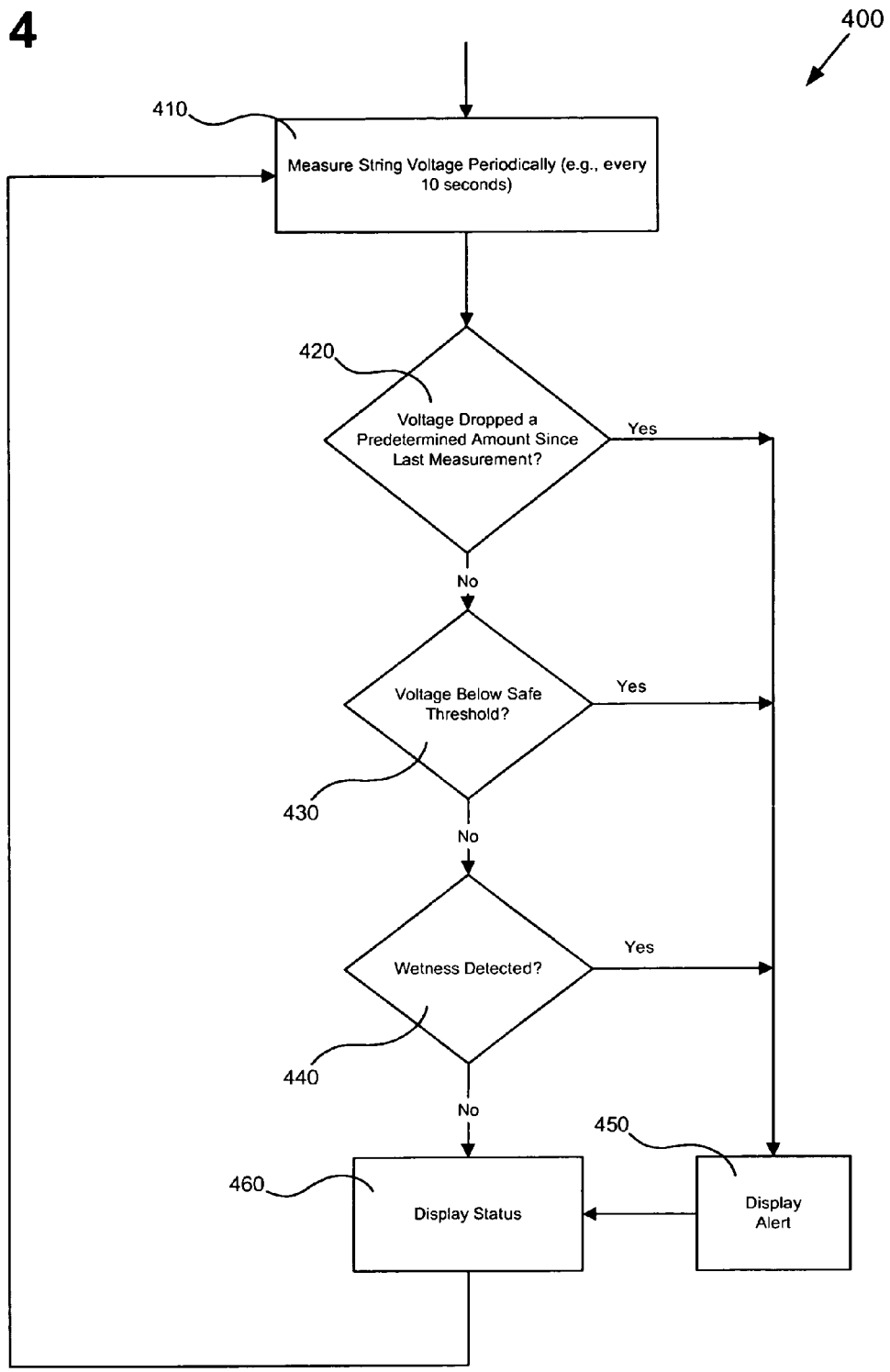
FIG. 4 is a flowchart of an exemplary application of the present invention.

FIG. 4 is a flowchart of an exemplary method of implementing an embodiment of the present invention. Certain details and features have been left out of flowchart 400 of FIG. 4 that are apparent to a person of ordinary skill in the art. For example, a step may consist of one or more sub-steps or may involve specialized equipment or materials, as known in the art. While STEPS 410 through 460 shown in flowchart 400 are sufficient to describe one embodiment of the present invention, other embodiments of the invention may utilize steps different from those shown in flowchart 400.

Referring to FIG. 4, at STEP 410 in flowchart 400, the method measures string voltage periodically. In one embodiment, the method measures string voltage approximately every 10 seconds. After STEP 410, the method of flowchart 400 of FIG. 4 proceeds to decision STEP 420.

At decision STEP 420 in flowchart 400, the method determines whether voltage has dropped a predetermined amount since the last measurement. In one embodiment, the predetermined amount is 25 mV. If the method determines that voltage has dropped a predetermined amount, the method proceeds to STEP 450 whereat the method displays an alert. If the method determines that voltage has not dropped a predetermined amount, the method proceeds to decision STEP 430.

At decision STEP 430 in flowchart 400, the method determines whether voltage is below a safe threshold. If the method determines that voltage is below a safe threshold, the method proceeds to STEP 450 whereat the method displays an alert. If the method determines that voltage is not below a safe threshold, the method proceeds to decision STEP 440.

At decision STEP 440 in flowchart 400, the method determines whether wetness is detected. If the method determines that wetness is detected, the method proceeds to STEP 450 whereat the method displays an alert. If the method determines that wetness is not detected, the method proceeds to STEP 460.

At STEP 450, the method displays an alert and proceeds to STEP 460. At STEP 460, the method displays the status of the batteries being monitored. After STEP 460, the method of flowchart 400 of FIG. 4 returns to STEP 410.

From the above description of the invention, it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

I claim:

1. A battery safety monitor, comprising:
   at least one battery comprising at least one cell string and providing at least one output signal;
   a Zener diode coupled to the at least one output signal of the at least one battery and capable of reducing a received voltage therefrom;
   a detector operatively coupled to an output of the Zener diode to determine a non-normal condition;
   a microcontroller operatively coupled to the output of the Zener diode and to the at least one output signal of the at least one battery; and
   an isolator coupled to an output of the microcontroller and providing an isolated signal to an external monitoring device.

2. The battery safety monitor of claim 1, wherein the isolator is an optoisolator.

3. The battery safety monitor of claim 1, wherein the detector is a wetness detector.

4. The battery safety monitor system of claim 3, wherein the wetness detector is operatively coupled to an A/D converter, and wherein said wetness detector is capable of detecting a dangerous battery condition.

5. The battery safety monitor system of claim 3, wherein said wetness detector comprises two narrowly spaced conductors that are operatively coupled to a high impedance voltage and an input of an A/D converter, wherein said wetness detector is configured to produce a reduced voltage when thionyl chloride condenses on said two narrowly spaced conductors.

6. The battery safety monitor system of claim 1 wherein said at least one battery is lithium based.

7. The battery safety monitor of claim 1, wherein the output of the Zener diode is an analog-to-digital (A/D) converter.

8. The battery safety monitor of claim 1, wherein the output of the microcontroller is a serial interface.

9. The battery safety monitor system of claim 8, wherein said serial interface comprises a UART.

10. The battery safety monitor of claim 1, further comprising a connector series-coupled to the isolated signal.

11. The battery safety monitor system of claim 10, wherein said connector comprises long wires.

12. The battery safety monitor of claim 1, wherein the at least one cell string, further comprises at least one of a positive thermal coefficient (PTC) device, a thermal fuse, a fuse, and a string isolation device.

13. The battery safety monitor of claim 12, wherein the string isolation device is a diode.

14. The battery safety monitor of claim 12, wherein the thermal fuse is series-coupled between the PTC and the at least one cell string, and the fuse is series-coupled between the at least one cell string and the string isolation device.

15. The battery safety monitor of claim 1, further comprising:
   a digital multiplexer operatively coupled to the isolated signal;
   a secondary microcontroller operatively coupled to the digital multiplexer;
   a display device operatively coupled to the secondary microcontroller, providing a status of the at least one battery; and
   an independent power supply providing power to the secondary microcontroller and the display device.

16. The battery safety monitor system of claim 15, wherein said display device is at least one of a visual alarm, audible alarm, relay switch and serial interface coupled to a display computer.

\* \* \* \* \*